(12) United States Patent
Son et al.

(10) Patent No.: US 7,379,502 B2
(45) Date of Patent: May 27, 2008

(54) METHOD OF CONVERTING DIGITAL DATA

(75) Inventors: Heui Gi Son, Seoul (KR); Bo Hyung Lee, Seoul (KR); Jae Jin Lee, Seoul (KR); Joo Hyun Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 724 days.

(21) Appl. No.: 10/039,794

(22) Filed: Oct. 19, 2001

(65) Prior Publication Data
US 2002/0126765 A1    Sep. 12, 2002

(30) Foreign Application Priority Data
Mar. 12, 2001    (KR) ............................... 2001-12638

(51) Int. Cl.
*H04B 14/04* (2006.01)
(52) U.S. Cl. ............... 375/242; 369/59.23; 369/59.24; 369/59.25; 369/59.26; 341/58; 341/59; 341/95
(58) Field of Classification Search ............... 375/242; 341/58, 59, 68, 95; 369/59.23–59.26
See application file for complete search history.

(56) References Cited

U.S. PATENT DOCUMENTS

| | | | | |
|---|---|---|---|---|
| 4,675,650 A | * | 6/1987 | Coppersmith et al. | ......... 341/58 |
| 4,728,929 A | * | 3/1988 | Tanaka | ......................... 341/73 |
| 4,930,115 A | * | 5/1990 | Verboom et al. | ......... 369/59.24 |
| 5,077,721 A | * | 12/1991 | Sako et al. | ............... 369/59.26 |
| 5,151,699 A | | 9/1992 | Moriyama | |
| 5,375,249 A | * | 12/1994 | Cho | ......................... 369/59.23 |
| 5,748,119 A | * | 5/1998 | Ko | ................................ 341/59 |
| 5,764,170 A | * | 6/1998 | Nabeta et al. | ................ 341/95 |
| 5,774,078 A | * | 6/1998 | Tanaka et al. | ................ 341/68 |
| 5,781,131 A | * | 7/1998 | Shimpuku et al. | ........... 341/58 |
| 5,790,056 A | * | 8/1998 | Schouhamer Immink | .... 341/58 |
| 5,818,367 A | * | 10/1998 | Okazaki et al. | ............ 341/106 |
| 5,870,037 A | * | 2/1999 | Okazaki et al. | .............. 341/58 |
| 5,912,869 A | * | 6/1999 | Tanaka et al. | ........... 369/59.23 |
| 5,920,272 A | * | 7/1999 | Schouhamer Immink | .... 341/59 |
| 5,940,585 A | * | 8/1999 | Vondran et al. | ............ 358/1.15 |
| 5,969,651 A | * | 10/1999 | Okazaki et al. | ............. 341/106 |

(Continued)

FOREIGN PATENT DOCUMENTS

EP    0 655 850 A3    5/1995

(Continued)

OTHER PUBLICATIONS

"Combi-Codes For DC-Free Runlength-Limited Coding", IEEE Transactions on Consumer Electronics, vol. 46, No. 4, Nov. 2000.

(Continued)

*Primary Examiner*—Curtis B. Odom
(74) *Attorney, Agent, or Firm*—Lee, Hong, Degerman, Kang & Schmadeka (57) ABSTRACT

Disclosed is a method of digital data conversion. The method includes binding input digital data into unit blocks constituted by a plurality of bytes, modulation-coding each byte of the input data blocks by using a code conversion table, and allocating a merging bit in block unit for the modulation-coded input data in block unit.

20 Claims, 8 Drawing Sheets

U.S. PATENT DOCUMENTS

| | | | | |
|---|---|---|---|---|
| 5,974,013 A * | 10/1999 | Kadono | | 369/47.49 |
| 5,987,066 A * | 11/1999 | Kojima et al. | | 375/253 |
| 5,990,899 A | 11/1999 | Whitten et al. | | |
| 6,002,814 A * | 12/1999 | Chadez | | 382/303 |
| 6,232,896 B1 * | 5/2001 | Coene et al. | | 341/102 |
| 6,265,994 B1 * | 7/2001 | Kahlman | | 341/58 |
| 6,268,810 B1 * | 7/2001 | Shim et al. | | 341/59 |
| 6,281,815 B1 * | 8/2001 | Shim et al. | | 341/59 |
| 6,297,753 B1 * | 10/2001 | Hayami | | 341/59 |
| 6,356,215 B1 * | 3/2002 | Coene | | 341/102 |
| 6,445,313 B2 * | 9/2002 | Ahn | | 341/59 |
| 6,452,885 B1 * | 9/2002 | Yeo | | 369/53.21 |
| 6,483,882 B1 * | 11/2002 | O'Dea | | 375/343 |
| 6,507,545 B2 * | 1/2003 | Levich et al. | | 369/47.16 |
| 6,748,079 B1 * | 6/2004 | Downing | | 380/201 |
| 2001/0019590 A1 * | 9/2001 | Ushio | | 375/242 |
| 2002/0009005 A1 * | 1/2002 | Kahlman et al. | | 365/201 |

FOREIGN PATENT DOCUMENTS

| | | |
|---|---|---|
| EP | 0655850 | 5/1995 |
| JP | 09-259531 | 10/1997 |
| JP | 2000-286709 | 10/2000 |
| JP | 2000-339871 | 12/2000 |
| WO | WO 96/32780 | 10/1996 |
| WO | WO 01/95495 A1 | 12/2001 |
| WO | WO 0195495 | 12/2001 |

OTHER PUBLICATIONS

8087 IEEE Transactions on Consumer Electronics 41 (1995) Aug., No. 3, New York, US, EFMPlus: The Coding Format of the Multimedia Compact Disc., Kees A. Schouhamer Immink, Philips Research Laboratories, 5656 AA Eindhoven, The Netherlands.

* cited by examiner

● Table

| Data Symbol | State 1 Code Word MSB LSB | State 1 Next State | State 2 Code Word MSB LSB | State 2 Next State | State 3 Code Word MSB LSB | State 3 Next State | State 4 Code Word MSB LSB | State 4 Next State |
|---|---|---|---|---|---|---|---|---|
| 0 | 000100100001000 | 1 | 100001000010000 | 1 | 010000000000100 | 1 | 001000000000100 | 1 |
| 1 | 000100100001000 | 2 | 100001000010000 | 2 | 010000000000100 | 2 | 001000000000100 | 2 |
| 2 | 000100100001000 | 3 | 100001000010000 | 3 | 010000000000100 | 3 | 001000000000100 | 3 |
| 3 | 000100100001000 | 4 | 100001000010000 | 4 | 010000000000100 | 4 | 001000000000100 | 4 |
| 4 | 000100100010001 | 1 | 100000010000010 | 1 | 010000000010010 | 1 | 001000000000010 | 1 |
| 5 | 000100100010001 | 4 | 100000010000010 | 3 | 010000000010010 | 3 | 001000000000010 | 3 |
| 6 | 000000100000100 | 1 | 100000010000010 | 4 | 010000000010010 | 4 | 001000000000010 | 4 |
| 7 | 000000100000100 | 2 | 100000000100001 | 1 | 010000000001001 | 1 | 001000000000001 | 1 |
| 8 | 000000100000100 | 3 | 100000000100001 | 4 | 010000000001001 | 4 | 001000000000001 | 4 |
| 9 | 000000100000100 | 4 | 100010000100000 | 1 | 010000000100100 | 1 | 001000000010010 | 1 |
| 10 | 000000100001001 | 1 | 100010000100000 | 2 | 010000000100100 | 2 | 001000000010010 | 3 |
| 11 | 000000100001001 | 4 | 100010000100000 | 3 | 010000000100100 | 3 | 001000000010010 | 4 |
| 12 | 000100010000100 | 1 | 100010000100000 | 4 | 010000000100100 | 4 | 001000000100100 | 1 |
| 13 | 000100010000100 | 2 | 100000100010010 | 1 | 010000000100010 | 1 | 001000000100100 | 2 |
| 14 | 000100010000100 | 3 | 100000100010010 | 3 | 010000000100010 | 3 | 001000000100100 | 3 |
| 15 | 000100010000100 | 4 | 100000100010010 | 4 | 010000000100010 | 4 | 001000000100100 | 4 |
| 16 | 000100010001001 | 1 | 100000010001001 | 1 | 010000000010001 | 1 | 001000000100010 | 1 |
| 17 | 000100010001001 | 4 | 100000010001001 | 4 | 010000000010001 | 4 | 001000000100010 | 3 |
| 18 | 000000100100100 | 1 | 100100001000000 | 1 | 010000001001000 | 1 | 001000000100010 | 4 |
| 19 | 000000100100100 | 2 | 100100001000000 | 2 | 010000001001000 | 2 | 001000000001001 | 1 |
| 20 | 000000100100100 | 3 | 100100001000000 | 3 | 010000001001000 | 3 | 001000000001001 | 4 |
| 21 | 000000100100100 | 4 | 100100001000000 | 4 | 010000001001000 | 4 | 001000001000010 | 1 |
| 22 | 000001000010001 | 1 | 100001001000010 | 1 | 010000001000010 | 1 | 001000001000010 | 3 |
| 23 | 000001000010001 | 4 | 100001001000010 | 3 | 010000001000010 | 3 | 001000001000010 | 4 |
| 24 | 000100000010000 | 1 | 100001000100010 | 4 | 010000001000010 | 4 | 001000001001000 | 1 |
| 25 | 000100000010000 | 2 | 100000100010001 | 1 | 010000001001001 | 1 | 001000001001000 | 2 |
| 26 | 000100000010000 | 3 | 100000100010001 | 4 | 010000001001001 | 4 | 001000001001000 | 3 |
| 27 | 000100000010000 | 4 | 100000000100000 | 1 | 010000010010000 | 1 | 001000001001000 | 4 |
| 28 | 000100000100001 | 1 | 100000000100000 | 2 | 010000010010000 | 2 | 001000010010010 | 1 |
| 29 | 000100000100001 | 4 | 100000000100000 | 3 | 010000010010000 | 3 | 001000010010010 | 3 |
| 30 | 000001000001000 | 1 | 100000000100000 | 4 | 010000010010000 | 4 | 001000010010010 | 4 |
| 31 | 000001000001000 | 2 | 100010001000010 | 1 | 010000010010010 | 1 | 001000000010001 | 1 |
| 32 | 000001000001000 | 3 | 100010001000010 | 3 | 010000010010010 | 3 | 001000000010001 | 4 |
| 33 | 000001000001000 | 4 | 100010001000010 | 4 | 010000010010010 | 4 | 001000100100010 | 1 |
| 34 | 000001001001001 | 1 | 100001000100001 | 1 | 010000010010001 | 1 | 001000100100010 | 3 |
| 35 | 000001001001001 | 4 | 100001000100001 | 4 | 010000010010001 | 4 | 001000100100010 | 4 |
| 36 | 000010010001000 | 1 | 100001000000100 | 1 | 010000100100000 | 1 | 001000100010000 | 1 |
| 37 | 000010010001000 | 2 | 100001000000100 | 2 | 010000100100000 | 2 | 001000010010000 | 2 |
| 38 | 000010010001000 | 3 | 100001000000100 | 3 | 010000100100000 | 3 | 001000010010000 | 3 |
| 39 | 000010010001000 | 4 | 100001000000100 | 4 | 010000100100000 | 4 | 001000010010000 | 4 |
| 40 | 000010010010001 | 1 | 100010010010010 | 1 | 010000100100010 | 1 | 001001001000010 | 1 |
| 41 | 000010010010001 | 4 | 100010010010010 | 3 | 010000100100010 | 3 | 001001001000010 | 3 |
| 42 | 000001001000100 | 1 | 100010010010010 | 4 | 010000100100010 | 4 | 001001001000010 | 4 |
| 43 | 000001001000100 | 2 | 100010001000001 | 1 | 010000100100001 | 1 | 001000001001001 | 1 |
| 44 | 000001001000100 | 3 | 100010001000001 | 4 | 010000100100001 | 4 | 001000001001001 | 4 |
| 45 | 000001001000100 | 4 | 100000100100100 | 1 | 010001001000000 | 1 | 001000010000010 | 1 |
| 46 | 000010000100001 | 1 | 100000100100100 | 2 | 010001001000000 | 2 | 001000001000010 | 3 |

FIG. 4B

| Data Symbol | State 1 Code Word MSB LSB | Next State | State 2 Code Word MSB LSB | Next State | State 3 Code Word MSB LSB | Next State | State 4 Code Word MSB LSB | Next State |
|---|---|---|---|---|---|---|---|---|
| 47 | 000010000100001 | 4 | 100000100100100 | 3 | 010001001000000 | 3 | 001000010000010 | 4 |
| 48 | 000010001000100 | 1 | 100000100100100 | 4 | 010001001000000 | 4 | 001000100100000 | 1 |
| 49 | 000010001000100 | 2 | 100100010000010 | 1 | 010001001000010 | 1 | 001000100100000 | 2 |
| 50 | 000010001000100 | 3 | 100100010000010 | 3 | 010001001000010 | 3 | 001000100100000 | 3 |
| 51 | 000010001000100 | 4 | 100100010000010 | 4 | 010001001000010 | 4 | 001000100100000 | 4 |
| 52 | 000010000010001 | 1 | 100100010000001 | 1 | 010001001000001 | 1 | 001000100010010 | 1 |
| 53 | 000010000010001 | 4 | 100100010000001 | 4 | 010001001000001 | 4 | 001000100010010 | 3 |
| 54 | 000010000010000 | 1 | 100001000001000 | 1 | 010010010000000 | 1 | 001000100010010 | 4 |
| 55 | 000010000010000 | 2 | 100001000001000 | 2 | 010010010000000 | 2 | 001000010010001 | 1 |
| 56 | 000010000010000 | 3 | 100001000001000 | 3 | 010010010000000 | 3 | 001000010010001 | 4 |
| 57 | 000010000010000 | 4 | 100001000001000 | 4 | 010010010000000 | 4 | 001001000100010 | 1 |
| 58 | 000010010001001 | 1 | 100100100010010 | 1 | 010010010000010 | 1 | 001001000100010 | 3 |
| 59 | 000010010001001 | 4 | 100100100010010 | 3 | 010010010000010 | 3 | 001001000100010 | 4 |
| 60 | 000010000001000 | 1 | 100100100010010 | 4 | 010010010000010 | 4 | 001001001000000 | 1 |
| 61 | 000010000001000 | 2 | 100000001000001 | 1 | 010010010000001 | 1 | 001001001000000 | 2 |
| 62 | 000010000001000 | 3 | 100000001000001 | 4 | 010010010000001 | 4 | 001001001000000 | 3 |
| 63 | 000010000001000 | 4 | 100001001000100 | 1 | 010000000001000 | 1 | 001001001000000 | 4 |
| 64 | 000001000001001 | 1 | 100001001000100 | 2 | 010000000001000 | 2 | 001000100000010 | 1 |
| 65 | 000001000001001 | 4 | 100001001000100 | 3 | 010000000001000 | 3 | 001000100000010 | 3 |
| 66 | 000010010000100 | 1 | 100001001000100 | 4 | 010000000001000 | 4 | 001000100000010 | 4 |
| 67 | 000010010000100 | 2 | 100000100000010 | 1 | 010000010000010 | 1 | 001000100100001 | 1 |
| 68 | 000010010000100 | 3 | 100000100000010 | 3 | 010000010000010 | 3 | 001000100100001 | 4 |
| 69 | 000010010000100 | 4 | 100000100000010 | 4 | 010000010000010 | 4 | 001001000010010 | 1 |
| 70 | 000100001000001 | 1 | 100000100001001 | 1 | 010000000100001 | 1 | 001001000010010 | 3 |
| 71 | 000100001000001 | 4 | 100000100001001 | 4 | 010000000100001 | 4 | 001001000010010 | 4 |
| 72 | 000001001001000 | 1 | 100010000010000 | 1 | 010000001000100 | 1 | 001000000001000 | 1 |
| 73 | 000001001001000 | 2 | 100010000010000 | 2 | 010000001000100 | 2 | 001000000001000 | 2 |
| 74 | 000001001001000 | 3 | 100010000010000 | 3 | 010000001000100 | 3 | 001000000001000 | 3 |
| 75 | 000001001001000 | 4 | 100010000010000 | 4 | 010000001000100 | 4 | 001000000001000 | 4 |
| 76 | 000000001000001 | 1 | 100001000010010 | 1 | 010000100010010 | 1 | 001001000000010 | 1 |
| 77 | 000000001000001 | 4 | 100001000010010 | 3 | 010000100010010 | 3 | 001001000000010 | 3 |
| 78 | 000100000100000 | 1 | 100001000010010 | 4 | 010000100010010 | 4 | 001001000000010 | 4 |
| 79 | 000100000100000 | 2 | 100001000010001 | 1 | 010000001001001 | 1 | 001001001000001 | 1 |
| 80 | 000100000100000 | 3 | 100001000010001 | 4 | 010000001001001 | 4 | 001001001000001 | 4 |
| 81 | 000100000100000 | 4 | 100010010000100 | 1 | 010000010001000 | 1 | 000100000000010 | 1 |
| 82 | 000100100001001 | 1 | 100010010000100 | 2 | 010000010001000 | 2 | 000100000000010 | 3 |
| 83 | 000100100001001 | 4 | 100010010000100 | 3 | 010000010001000 | 3 | 000100000000010 | 4 |
| 84 | 000001000100100 | 1 | 100010010000100 | 4 | 010000010001000 | 4 | 001000001000100 | 1 |
| 85 | 000001000100100 | 2 | 100010000100010 | 1 | 010001000100010 | 1 | 001000001000100 | 2 |
| 86 | 000001000100100 | 3 | 100010000100010 | 3 | 010001000100010 | 3 | 001000001000100 | 3 |
| 87 | 000001000100100 | 4 | 100010000100010 | 4 | 010001000100010 | 4 | 001000001000100 | 4 |
| 88 | 000100100100001 | 1 | 100001001001001 | 1 | 010000100010001 | 1 | 000010000000010 | 1 |
| 89 | 000100100100001 | 4 | 100001001001001 | 4 | 010000100010001 | 4 | 000010000000010 | 3 |
| 90 | 000100100000100 | 1 | 100100000100000 | 1 | 010000100010000 | 1 | 000010000000010 | 4 |
| 91 | 000100100000100 | 2 | 100100000100000 | 2 | 010000100010000 | 2 | 000010000100001 | 1 |
| 92 | 000100100000100 | 3 | 100100000100000 | 3 | 010000100010000 | 3 | 000010000100001 | 4 |
| 93 | 000100100000100 | 4 | 100100000100000 | 4 | 010000100010000 | 4 | 000100000010010 | 1 |
| 94 | 000000010001001 | 1 | 100100010000010 | 1 | 010010001000010 | 1 | 000100000010010 | 3 |

FIG. 4C

| Data Symbol | State 1 Code Word MSB  LSB | State 1 Next State | State 2 Code Word MSB  LSB | State 2 Next State | State 3 Code Word MSB  LSB | State 3 Next State | State 4 Code Word MSB  LSB | State 4 Next State |
|---|---|---|---|---|---|---|---|---|
| 95 | 000000010001001 | 4 | 100100001000010 | 3 | 010010001000010 | 3 | 000100000010010 | 4 |
| 96 | 000001000000100 | 1 | 100100001000010 | 4 | 010010001000010 | 4 | 001000010001000 | 1 |
| 97 | 000001000000100 | 2 | 100010000100001 | 1 | 010001000100001 | 1 | 001000010001000 | 2 |
| 98 | 000001000000100 | 3 | 100010000100001 | 4 | 010001000100001 | 4 | 001000010001000 | 3 |
| 99 | 000001000000100 | 4 | 100100100000100 | 1 | 010001000100000 | 1 | 001000010001000 | 4 |
| 100 | 000100010010001 | 1 | 100100100000100 | 2 | 010001000100000 | 2 | 000001000000010 | 1 |
| 101 | 000100010010001 | 4 | 100100100000100 | 3 | 010001000100000 | 3 | 000001000000010 | 3 |
| 102 | 000100100100100 | 1 | 100100100000100 | 4 | 010001000100000 | 4 | 000001000000010 | 4 |
| 103 | 000100100100100 | 2 | 100100010010010 | 1 | 010010010010010 | 1 | 001000010001001 | 1 |
| 104 | 000100100100100 | 3 | 100100010010010 | 3 | 010010010010010 | 3 | 001000010001001 | 4 |
| 105 | 000100100100100 | 4 | 100100010010010 | 4 | 010010010010010 | 4 | 000010000010010 | 1 |
| 106 | 000000100010001 | 1 | 100010010001001 | 1 | 010010001000001 | 1 | 000010000010010 | 3 |
| 107 | 000000100010001 | 4 | 100010010001001 | 4 | 010010001000001 | 4 | 000010000010010 | 4 |
| 108 | 000100100010000 | 1 | 100100100100100 | 1 | 010010001000000 | 1 | 001000100010000 | 1 |
| 109 | 000100100010000 | 2 | 100100100100100 | 2 | 010010001000000 | 2 | 001000100010000 | 2 |
| 110 | 000100100010000 | 3 | 100100100100100 | 3 | 010010001000000 | 3 | 001000100010000 | 3 |
| 111 | 000100100010000 | 4 | 100100100100100 | 4 | 010010001000000 | 4 | 001000100010000 | 4 |
| 112 | 000100001001001 | 1 | 100100100100010 | 1 | 010000100000010 | 1 | 000100000100010 | 1 |
| 113 | 000100001001001 | 4 | 100100100100010 | 3 | 010000100000010 | 3 | 000100000100010 | 3 |
| 114 | 000000010000100 | 1 | 100100100100010 | 4 | 010000100000010 | 4 | 000100000100010 | 4 |
| 115 | 000000010000100 | 2 | 100100001000001 | 1 | 010000001000001 | 1 | 001000100010001 | 1 |
| 116 | 000000010000100 | 3 | 100100001000001 | 4 | 010000001000001 | 4 | 001000100010001 | 4 |
| 117 | 000000010000100 | 4 | 100000001000000 | 1 | 010000000010000 | 1 | 000000100000010 | 1 |
| 118 | 000001000100001 | 1 | 100000001000000 | 2 | 010000000010000 | 2 | 000000100000010 | 3 |
| 119 | 000001000100001 | 4 | 100000001000000 | 3 | 010000000010000 | 3 | 000000100000010 | 4 |
| 120 | 000100010001000 | 1 | 100000001000000 | 4 | 010000000010000 | 4 | 001001000100000 | 1 |
| 121 | 000100010001000 | 2 | 100001000000010 | 1 | 010001000010010 | 1 | 001001000100000 | 2 |
| 122 | 000100010001000 | 3 | 100001000000010 | 3 | 010001000010010 | 3 | 001001000100000 | 3 |
| 123 | 000100010001000 | 4 | 100001000000010 | 4 | 010001000010010 | 4 | 001001000100000 | 4 |
| 124 | 000100000010001 | 1 | 100100100001001 | 1 | 010000100001001 | 1 | 000001000010010 | 1 |
| 125 | 000100000010001 | 4 | 100100100001001 | 4 | 010000100001001 | 4 | 000001000010010 | 3 |
| 126 | 000000100001000 | 1 | 100001000000100 | 1 | 010000010000100 | 1 | 000001000010010 | 4 |
| 127 | 000000100001000 | 2 | 100001000000100 | 2 | 010000010000100 | 2 | 001001000100001 | 1 |
| 128 | 000000100001000 | 3 | 100001000000100 | 3 | 010000010000100 | 3 | 001001000100001 | 4 |
| 129 | 000000100001000 | 4 | 100001000000100 | 4 | 010000010000100 | 4 | 000010000100010 | 1 |
| 130 | 000010001000001 | 1 | 100010000010010 | 1 | 010010000100010 | 1 | 000010000100010 | 3 |
| 131 | 000010001000001 | 4 | 100010000010010 | 3 | 010010000100010 | 3 | 000010000100010 | 4 |
| 132 | 000100001000100 | 1 | 100010000010010 | 4 | 010010000100010 | 4 | 001000000010000 | 1 |
| 133 | 000100001000100 | 2 | 100000010000001 | 1 | 010001000010001 | 1 | 001000000010000 | 2 |
| 134 | 000100001000100 | 3 | 100000010000001 | 4 | 010001000010001 | 4 | 001000000010000 | 3 |
| 135 | 000100001000100 | 4 | 100001000100100 | 1 | 010000100001000 | 1 | 001000000010000 | 4 |
| 136 | 000010001001001 | 1 | 100001000100100 | 2 | 010000100001000 | 2 | 000100001000010 | 1 |
| 137 | 000010001001001 | 4 | 100001000100100 | 3 | 010000100001000 | 3 | 000100001000010 | 3 |
| 138 | 000001000010000 | 1 | 100001000100100 | 4 | 010000100001000 | 4 | 000100001000010 | 4 |
| 139 | 000001000010000 | 2 | 100100000100010 | 1 | 010001000000010 | 1 | 001000001000001 | 1 |
| 140 | 000001000010000 | 3 | 100100000100010 | 3 | 010001000000010 | 3 | 001000001000001 | 4 |
| 141 | 000001000010000 | 4 | 100100000100010 | 4 | 010001000000010 | 4 | 000100010010010 | 1 |
| 142 | 000100010000001 | 1 | 100001000001001 | 1 | 010001001001001 | 1 | 000100010010010 | 3 |

FIG. 4D

| Data Symbol | State 1 Code Word MSB LSB | State 1 Next State | State 2 Code Word MSB LSB | State 2 Next State | State 3 Code Word MSB LSB | State 3 Next State | State 4 Code Word MSB LSB | State 4 Next State |
|---|---|---|---|---|---|---|---|---|
| 143 | 000100010000001 | 4 | 100001000001001 | 4 | 010001001001001 | 4 | 000100010010010 | 4 |
| 144 | 000100000001000 | 1 | 100001001001000 | 1 | 010001000010000 | 1 | 001000010000100 | 1 |
| 145 | 000100000001000 | 2 | 100001001001000 | 2 | 010001000010000 | 2 | 001000010000100 | 2 |
| 146 | 000100000001000 | 3 | 100001001001000 | 3 | 010001000010000 | 3 | 001000010000100 | 3 |
| 147 | 000100000001000 | 4 | 100001001001000 | 4 | 010001000010000 | 4 | 001000010000100 | 4 |
| 148 | 000010000001001 | 1 | 100010000010001 | 1 | 010010000010010 | 1 | 000000010000010 | 1 |
| 149 | 000010000001001 | 4 | 100010000010001 | 4 | 010010000010010 | 3 | 000000010000010 | 3 |
| 150 | 000010000100000 | 1 | 100010000001000 | 1 | 010010000010010 | 4 | 000000010000010 | 4 |
| 151 | 000010000100000 | 2 | 100010000001000 | 2 | 010010000100001 | 1 | 001000100001001 | 1 |
| 152 | 000010000100000 | 3 | 100010000001000 | 3 | 010010000100001 | 4 | 001000100001001 | 4 |
| 153 | 000010000100000 | 4 | 100010000001000 | 4 | 010010000100000 | 1 | 000000100010010 | 1 |
| 154 | 000010010010001 | 1 | 100010010010001 | 1 | 010010000100000 | 2 | 000000100010010 | 3 |
| 155 | 000010010010001 | 4 | 100010010010001 | 4 | 010010000100000 | 3 | 000000100010010 | 4 |
| 156 | 000010010010000 | 1 | 100010001000100 | 1 | 010010000100000 | 4 | 001000100001000 | 1 |
| 157 | 000010010010000 | 2 | 100010001000100 | 2 | 010010000000010 | 1 | 001000100001000 | 2 |
| 158 | 000010010010000 | 3 | 100010001000100 | 3 | 010010000000010 | 3 | 001000100001000 | 3 |
| 159 | 000010010010000 | 4 | 100010001000100 | 4 | 010010000000010 | 4 | 001000100001000 | 4 |
| 160 | 000000100000001 | 1 | 100100000100001 | 1 | 010010010001001 | 1 | 000001000100010 | 1 |
| 161 | 000000100000001 | 4 | 100100000100001 | 4 | 010010010001001 | 4 | 000001000100010 | 3 |
| 162 | 000100001000000 | 1 | 100010010001000 | 1 | 010000000100000 | 1 | 000001000100010 | 4 |
| 163 | 000100001000000 | 2 | 100010010001000 | 2 | 010000000100000 | 2 | 001001000010001 | 1 |
| 164 | 000100001000000 | 3 | 100010010001000 | 3 | 010000000100000 | 3 | 001001000010001 | 4 |
| 165 | 000100001000000 | 4 | 100010010001000 | 4 | 010000000100000 | 4 | 001001000010000 | 1 |
| 166 | 000000100100001 | 1 | 100100010001001 | 1 | 010000010000001 | 1 | 001001000010000 | 2 |
| 167 | 000000100100001 | 4 | 100100010001001 | 4 | 010000010000001 | 4 | 001001000010000 | 3 |
| 168 | 000010001001000 | 1 | 100100000010000 | 1 | 010000100000100 | 1 | 001001000010000 | 4 |
| 169 | 000010001001000 | 2 | 100100000010000 | 2 | 010000100000100 | 2 | 000010001000010 | 1 |
| 170 | 000010001001000 | 3 | 100100000010000 | 3 | 010000100000100 | 3 | 000010001000010 | 3 |
| 171 | 000010001001000 | 4 | 100100000010000 | 4 | 010000100000100 | 4 | 000010001000010 | 4 |
| 172 | 000100000001001 | 1 | 100100100010001 | 1 | 010001000001001 | 1 | 001001001001001 | 1 |
| 173 | 000100000001001 | 4 | 100100100010001 | 4 | 010001000001001 | 4 | 001001001001001 | 4 |
| 174 | 000000001000100 | 1 | 100100010000100 | 1 | 010000100100100 | 1 | 001000000100000 | 1 |
| 175 | 000000001000100 | 2 | 100100010000100 | 2 | 010000100100100 | 2 | 001000000100000 | 2 |
| 176 | 000000001000100 | 3 | 100100010000100 | 3 | 010000100100100 | 3 | 001000000100000 | 3 |
| 177 | 000000001000100 | 4 | 100100010000100 | 4 | 010000100100100 | 4 | 001000000100000 | 4 |
| 178 | 000001001000001 | 1 | 100000100000001 | 1 | 010010000010001 | 1 | 000010010010010 | 1 |
| 179 | 000001001000001 | 4 | 100000100000001 | 4 | 010010000010001 | 4 | 000010010010010 | 3 |
| 180 | 000010000100100 | 1 | 100100100001000 | 1 | 010001000001000 | 1 | 000010010010010 | 4 |
| 181 | 000010000100100 | 2 | 100100100001000 | 2 | 010001000001000 | 2 | 001000010000001 | 1 |
| 182 | 000010000100100 | 3 | 100100100001000 | 3 | 010001000001000 | 3 | 001000010000001 | 4 |
| 183 | 000010000100100 | 4 | 100100100001000 | 4 | 010001000001000 | 4 | 001000100000100 | 1 |
| 184 | 000001000000001 | 1 | 100010000001001 | 1 | 010010001001001 | 1 | 001000100000100 | 2 |
| 185 | 000001000000001 | 4 | 100010000001001 | 4 | 010010001001001 | 4 | 001000100000100 | 3 |
| 186 | 000000010001000 | 1 | 100000010000000 | 1 | 010001001000100 | 1 | 001000100000100 | 4 |
| 187 | 000000010001000 | 2 | 100000010000000 | 2 | 010001001000100 | 2 | 000100010000010 | 1 |
| 188 | 000000010001000 | 3 | 100000010000000 | 3 | 010001001000100 | 3 | 000100010000010 | 3 |
| 189 | 000000010001000 | 4 | 100000010000000 | 4 | 010001001000100 | 4 | 000100010000010 | 4 |
| 190 | 000010010000001 | 1 | 100010001001001 | 1 | 010010010010001 | 1 | 001001000001001 | 1 |

FIG. 4E

| Data Symbol | State 1 Code Word MSB LSB | Next State | State 2 Code Word MSB LSB | Next State | State 3 Code Word MSB LSB | Next State | State 4 Code Word MSB LSB | Next State |
|---|---|---|---|---|---|---|---|---|
| 191 | 000010010000001 | 4 | 100010001001001 | 4 | 010010010010001 | 4 | 001001000001001 | 4 |
| 192 | 000010000000100 | 1 | 100010000000100 | 1 | 010010000010000 | 1 | 001000100100100 | 1 |
| 193 | 000010000000100 | 2 | 100010000000100 | 2 | 010010000010000 | 2 | 001000100100100 | 2 |
| 194 | 000010000000100 | 3 | 100010000000100 | 3 | 010010000010000 | 3 | 001000100100100 | 3 |
| 195 | 000010000000100 | 4 | 100010000000100 | 4 | 010010000010000 | 4 | 001000100100100 | 4 |
| 196 | 000010000000001 | 1 | 100100000010001 | 1 | 010000100000001 | 1 | 000100100010010 | 1 |
| 197 | 000010000000001 | 4 | 100100000010001 | 4 | 010000100000001 | 4 | 000100100010010 | 3 |
| 198 | 000000100010000 | 1 | 100010000100100 | 1 | 010010010000100 | 1 | 000100100010010 | 4 |
| 199 | 000000100010000 | 2 | 100010000100100 | 2 | 010010010000100 | 2 | 001000100000001 | 1 |
| 200 | 000000100010000 | 3 | 100010000100100 | 3 | 010010010000100 | 3 | 001000100000001 | 4 |
| 201 | 000000100010000 | 4 | 100010000100100 | 4 | 010010010000100 | 4 | 001001000001000 | 1 |
| 202 | 000100100000001 | 1 | 100100001001001 | 1 | 010010000001001 | 1 | 001001000001000 | 2 |
| 203 | 000100100000001 | 4 | 100100010001001 | 4 | 010010000001001 | 4 | 001001000001000 | 3 |
| 204 | 000001000100000 | 1 | 100010001001000 | 1 | 010000001000000 | 1 | 001001000001000 | 4 |
| 205 | 000001000100000 | 2 | 100010001001000 | 2 | 010000001000000 | 2 | 000000001000010 | 1 |
| 206 | 000001000100000 | 3 | 100010001001000 | 3 | 010000001000000 | 3 | 000000001000010 | 3 |
| 207 | 000001000100000 | 4 | 100010001001000 | 4 | 010000001000000 | 4 | 000000001000010 | 4 |
| 208 | 000000010000000 | 1 | 100100010010001 | 1 | 010001000000001 | 1 | 001001000000001 | 1 |
| 209 | 000000010000000 | 2 | 100100010010001 | 4 | 010001000000001 | 4 | 001001000000001 | 4 |
| 210 | 000000010000000 | 3 | 100010010010000 | 1 | 010001000000100 | 1 | 001001001000100 | 1 |
| 211 | 000000010000000 | 4 | 100010010010000 | 2 | 010001000000100 | 2 | 001001001000100 | 2 |
| 212 | 000010001000000 | 1 | 100010010010000 | 3 | 010001000000100 | 3 | 001001001000100 | 3 |
| 213 | 000010001000000 | 2 | 100010010010000 | 4 | 010001000000100 | 4 | 001001001000100 | 4 |
| 214 | 000010001000000 | 3 | 100100100100001 | 1 | 010010000000001 | 1 | 000000010010010 | 1 |
| 215 | 000010001000000 | 4 | 100100100100001 | 4 | 010010000000001 | 4 | 000000010010010 | 3 |
| 216 | 000100100100000 | 1 | 100100000001000 | 1 | 010001000100100 | 1 | 000000010010010 | 4 |
| 217 | 000100100100000 | 2 | 100100000001000 | 2 | 010001000100100 | 2 | 000100000000001 | 1 |
| 218 | 000100100100000 | 3 | 100100000001000 | 3 | 010001000100100 | 3 | 000100000000001 | 4 |
| 219 | 000100100100000 | 4 | 100100000001000 | 4 | 010001000100100 | 4 | 001000001000000 | 1 |
| 220 | 000100010000000 | 1 | 100001000000001 | 1 | 010001001001000 | 1 | 001000001000000 | 2 |
| 221 | 000100010000000 | 2 | 100001000000001 | 2 | 010001001001000 | 2 | 001000001000000 | 3 |
| 222 | 000100010000000 | 3 | 100100001000100 | 1 | 010001001001000 | 3 | 001000001000000 | 4 |
| 223 | 000100010000000 | 4 | 100100001000100 | 2 | 010001001001000 | 4 | 000000100100010 | 1 |
| 224 | 000100010010000 | 1 | 100100001000100 | 3 | 010010000001000 | 1 | 000000100100010 | 3 |
| 225 | 000100010010000 | 2 | 100100001000100 | 4 | 010010000001000 | 2 | 000000100100010 | 4 |
| 226 | 000100010010000 | 3 | 100100000001001 | 1 | 010010000001000 | 3 | 000001001000000 | 2 |
| 227 | 000100010010000 | 4 | 100100000001001 | 4 | 010010000001000 | 4 | 000001001000000 | 3 |
| 228 | 000000001001000 | 1 | 100100010001000 | 1 | 010010001000100 | 1 | 001001000000100 | 1 |
| 229 | 000000001001000 | 2 | 100100010001000 | 2 | 010010001000100 | 2 | 001001000000100 | 2 |
| 230 | 000000001001000 | 3 | 100100010001000 | 3 | 010010001000100 | 3 | 001001000000100 | 3 |
| 231 | 000000001001000 | 4 | 100100010001000 | 4 | 010010001000100 | 4 | 001001000000100 | 4 |
| 232 | 000100001001000 | 1 | 100100100010000 | 1 | 010010010001000 | 1 | 000001001000010 | 1 |
| 233 | 000100001001000 | 2 | 100100100010000 | 2 | 010010010001000 | 2 | 000001001000010 | 3 |
| 234 | 000100001001000 | 3 | 100100100010000 | 3 | 010010010001000 | 3 | 000001001000010 | 4 |
| 235 | 000100001001000 | 4 | 100100100010000 | 4 | 010010010001000 | 4 | 001001000100100 | 1 |
| 236 | 000000010010000 | 1 | 100100000000100 | 1 | 010000010000000 | 1 | 001001000100100 | 2 |
| 237 | 000000010010000 | 2 | 100100000000100 | 2 | 010000010000000 | 2 | 001001000100100 | 3 |
| 238 | 000000010010000 | 3 | 100100000000100 | 3 | 010000010000000 | 3 | 001001000100100 | 4 |

FIG. 4F

| Data Symbol | State 1 Code Word MSB LSB | Next State | State 2 Code Word MSB LSB | Next State | State 3 Code Word MSB LSB | Next State | State 4 Code Word MSB LSB | Next State |
|---|---|---|---|---|---|---|---|---|
| 239 | 000000010010000 | 4 | 100100000000100 | 4 | 010000010000000 | 4 | 000010010000010 | 1 |
| 240 | 000100000100100 | 1 | 100100000100100 | 1 | 010010000000100 | 1 | 000010010000010 | 3 |
| 241 | 000100000100100 | 2 | 100100000100100 | 2 | 010010000000100 | 2 | 000010010000010 | 4 |
| 242 | 000100000100100 | 3 | 100100000100100 | 3 | 010010000000100 | 3 | 001001001001000 | 1 |
| 243 | 000100000100100 | 4 | 100100000100100 | 4 | 010010000000100 | 4 | 001001001001000 | 2 |
| 244 | 000000100100000 | 1 | 100100001001000 | 1 | 010010000100100 | 1 | 001001001001000 | 3 |
| 245 | 000000100100000 | 2 | 100100001001000 | 2 | 010010000100100 | 2 | 001001001001000 | 4 |
| 246 | 000000100100000 | 3 | 100100001001000 | 3 | 010010000100100 | 3 | 000100100000010 | 1 |
| 247 | 000000100100000 | 4 | 100100001001000 | 4 | 010010000100100 | 4 | 000100100000010 | 3 |
| 248 | 000100000000100 | 1 | 100100010010000 | 1 | 010010001001000 | 1 | 000100100000010 | 4 |
| 249 | 000100000000100 | 2 | 100100010010000 | 2 | 010010001001000 | 2 | 001000010000000 | 1 |
| 250 | 000100000000100 | 3 | 100100010010000 | 3 | 010010001001000 | 3 | 001000010000000 | 2 |
| 251 | 000100000000100 | 4 | 100100010010000 | 4 | 010010001001000 | 4 | 001000010000000 | 3 |
| 252 | 000001001000000 | 1 | 100100100100000 | 1 | 010010010010000 | 1 | 001000010000000 | 4 |
| 253 | 000001001000000 | 2 | 100100100100000 | 2 | 010010010010000 | 2 | 000100100100010 | 1 |
| 254 | 000001001000000 | 3 | 100100100100000 | 3 | 010010010010000 | 3 | 000100100100010 | 3 |
| 255 | 000001001000000 | 4 | 100100100100000 | 4 | 010010010010000 | 4 | 000100100100010 | 4 |

METHOD OF CONVERTING DIGITAL DATA

CROSS-REFERENCE TO RELATED APPLICATIONS

Pursuant to 35 U.S.C. § 119(a), this application claims the benefit of earlier filing date and right of priority to the Korean Application No. 2001-12638, filed on Mar. 12, 2001, the content of which is hereby incorporated by reference herein in its entirety.

BACKGROUND OF THE INVENTION

1. Field of the Invention

The present invention relates to a method of modulation and demodulation for recording digital data to a recording or reproducing medium that can record or reproduce the digital data. In particular, the present invention relates to a method of data conversion suitable for recording the digital data to an optical record medium in high or low density, a method of record reproduction using the same, and an optical record medium recorded with the modulated data.

2. Description of the Prior Art

A method of eight to fourteen modulation (EFM)(8/17 modulation) coding is provided as a method for recording digital data through encoding. A method of digital data modulation such as EFM or EFM plus is applied to record data, in particular, to an optical record medium or disk including CD, CD-R, CD-RW, DVD and so on.

In recording the digital data to a recording medium such as optical record medium, a recording capacity is an important item to be considered. In other words, since the same disk can contain more information when information is recorded in high density, a recording density of digital data is determined according to the method of modulation.

The EFM code in use for recording the digital data on a CD-type optical record medium has a Run Length Limited (RLL), in which d is 2 and k is 10, and a code rate corresponding to R=8/17. Referring to a coding method using the EFM code, an eight bit source code is converted to a fourteen bit d-restraint code word, which is attached with a three bit merging word. The three bit merging word is selected by an encoder to satisfy the minimum and maximum run lengths, the inherent codes for satisfying the maximum and minimum run lengths are not uniquely determined. Further, the merging word is selected so that power density is minimized in low frequency.

Figure 1:
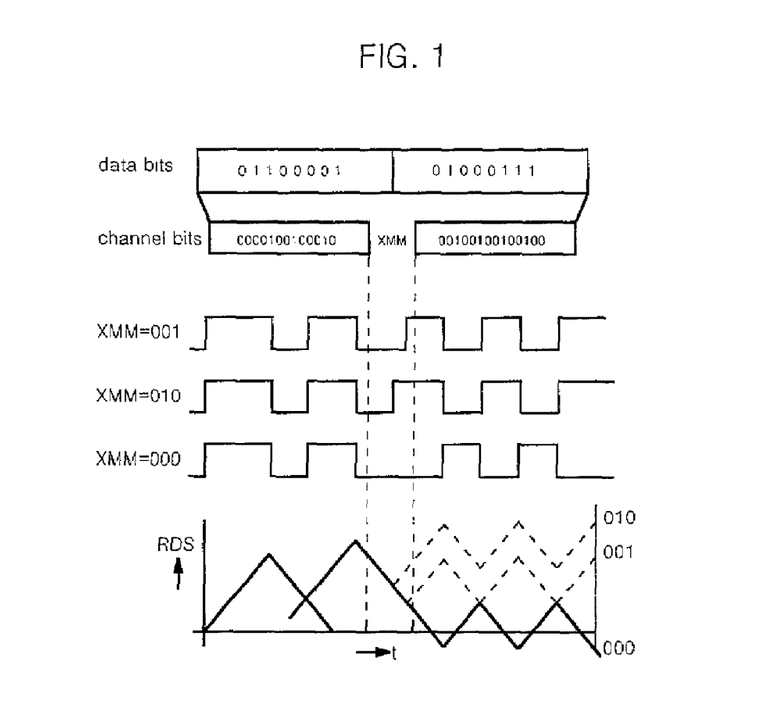
FIG. 1 illustrates a merging process in the EFM coding.

FIG. 1 shows an example of a merging processor, in which eight user data bits are converted to fourteen channel bits using a look-up table, and to the end of the fourteen bits is attached with a merging bit satisfying three run length limitations.

Since two zeros are necessarily present between two ones, '0' is necessarily present in the first merging bit position in the foregoing situation. Therefore, the merging bits can exist in three cases such as 000, 010 and 001. In this case, the encoder is adapted to select a merging bit having the lowest absolute value for a Running Digital Sum (RDS) at the end of a new code word, and accordingly 000 in the above situation. In an experiment about CD, when only two merging bits are used, compression of low frequency components (DC compression) is not sufficiently efficient. Therefore, when the number of merging bits is increased to three, margin of transition setting or omission in the merging bits is increased more.

In general, a good method of compression about the low frequency components by a compensated merging method without providing a certain standard about a CD system. For example, compression can be executed through a look-ahead method since the minimization about the low frequency components in a short term does not always influence the minimization in a longer term. In this case, it is reported that performance improvement of 6 to 10 dB is obtained.

Meanwhile, the EFM plus code used in DVDs is a sliding block code capable of restraining the low frequency components in which the code rate is 8/16 and the RLL is (2, 10). The EFM plus code, which has the code rate higher than the previous EFM code about 6% as an advantage, is re-designed from the EFM code by replacing the 8/17 code rate with the 8/16 code rate and has the two merging bits instead of the merging bits of three bit.

As described hereinbefore, the CD, CD-ROM, CD-V and the like are proposed as very successful media for storing MPEG video data and other various digital information. However, the storage capacity of about 680 Mbytes is not sufficient for the operation of a graphic-based computer or to store high-definition digital video programs. A DVD, which can be an expansion of the CDs, is a novel optical record medium with a storage capacity of at least 7 times of a typical CD. The increase of storage capacity is made through the quality elevation of a light source and an object lens. Besides, the storage capacity of the DVD is increased by totally re-designing a logical mode of the disk through use of more enhanced RS-PC and a record code called the EFM plus, in which the EFM plus has a code rate of 8/16 with (d,k)=(2,10) and is constituted by sliding-block codes for restraining low-frequency components.

As described above, the code rate and the DC compression are very important factors in the high-density record of data and the reliability thereof when recording the digital data to the record medium, for example the optical record medium, and accordingly more various and improved methods are continuously required to satisfy the factors.

SUMMARY OF INVENTION

Accordingly, the present invention has been made to solve the foregoing problems of the related art, and it is an object of the invention to provide a method of digital data conversion, comprising the following steps of: binding input digital data into unit blocks constituted by a plurality of bytes; modulation-coding each byte of the input data blocks by using a code conversion table; and allocating a merging bit in block unit for the modulation-coded input data in block unit.

The present invention further provides a method of digital data conversion, comprising the following steps of: performing 8/15 modulation-coding to an input data block in the unit of m byte and simultaneously producing an RDS of the block in the corresponding order; considering the RDS of the block in the corresponding order and an RDS of the previous block to select a merging bit; and outputting the selected merging bit, following by outputting the encoded block in the corresponding order, and updating the RDS for selection of a merging bit in the next block in order.

Further, the present invention provides a method of recording and reproducing digital data, comprising the following steps of: binding input digital data into unit blocks constituted by a plurality of bytes and modulation-coding the bytes; allocating a merging bit in block unit for the modulation-coded input data in block unit; recording a byte-unit information expressing the number of the bytes constituting each of the data blocks together with data added with the merging bit after modulation-coding; and performing data decoding for the corresponding block by using the recorded byte-unit information.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE INVENTION

A method of converting digital data of the invention comprises the following steps of: binding input digital data into unit blocks constituted by a plurality of bytes; modulation-coding each byte of the input data blocks by using a code conversion table; and allocating a merging bit in block unit for the modulation-coded input data in block unit.

The method of converting digital data of the invention is characterized in that the each of the input data block is bound in the unit of 3 to 7 bytes.

Also, the method of converting digital data of the invention is characterized in that the merging bit allocate in a block unit is constituted by 3 bits.

The method of converting digital data of the invention is also characterized in that each of the modulation-coded input data block is encoded into a code word of a 15 bits length by an 8/15 conversion table.

Further, Also, the method of converting digital data of the invention is characterized in that an RDS of the present input data block is compared to an RDS of the previous input data block to select the merging bit so that the RDS has the minimum value without violating RLL restraints when the present input data block is produced.

Also, the method of converting digital data of the invention is characterized in that the selected merging bit is primarily outputted, and then the encoded present input data block is outputted and simultaneously an RDS up to the present block is updated to prepare merging bit selection of the next block.

Another method of converting digital data of the invention comprises the following steps of: performing 8/15 modulation-coding to an input data block in the unit of m (wherein m is 3 to 7) byte and simultaneously producing an RDS of the block in the corresponding order; considering the RDS of the block in the corresponding order and an RDS of the previous block to select a merging bit; and outputting the selected merging bit, following by outputting the encoded block in the corresponding order, and updating the RDS for selection of a merging bit in the next block in order.

A method of recording and reproducing digital data of the invention comprises the following steps of: binding input digital data into unit blocks constituted by a plurality of bytes and modulation-coding the bytes; allocating a merging bit in block unit for the modulation-coded input data in block unit; recording a byte-unit information expressing the number of the bytes constituting each of the data blocks together with data added with the merging bit after modulation-coding; and performing data decoding for the corresponding block by using the recorded byte-unit information.

Also, the method of recording and reproducing digital data of the invention is characterized in that each of the input data blocks is modulation-coded and decoded in the unit of 3 to 7 bytes.

Further, the method of recording and reproducing digital data of the invention is characterized in that the merging bit is selected from the merging bits of 3 bit so that the RDS value may not be the minimum while violating RLL restraints.

Hereinafter more detailed description will be made for embodiments of the invention in reference to the accompanying drawings.

Figure 2:
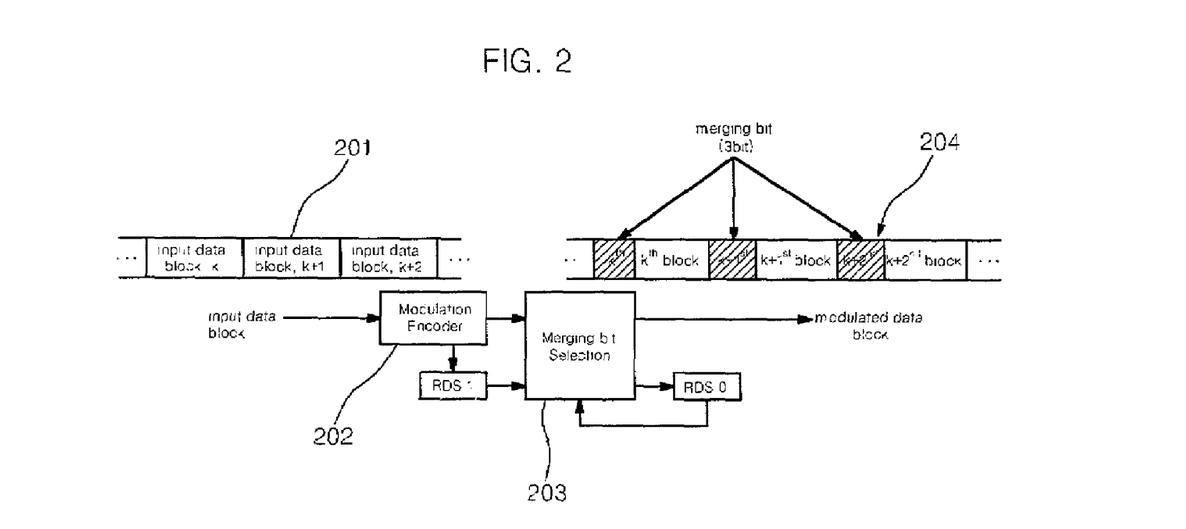
FIG. 2 is a block diagram for illustrating a method of digital data modulation according to the invention.

FIG. 2 is a block diagram for illustrating a method of digital data modulation of the invention.

First, merging bits are added in block unit in the invention, in which the blocks are defined as follows.

In defining one input data block 201, m bytes are bound as one unit block.

Herein, m means an input data bundle of at least 2 bytes, preferably 3 to 7 bytes.

Each byte of the input data block is inputted into a modulation encoder 202 and encoded into a code word of 15 bit length by using an 8/15 conversion table (refer to FIG. 4). The result of encoding forms a data block of m X 15 bit length (kth block).

The 8/15 conversion table is used to convert the input data, in which the 8/15 conversion table is constituted to have the value of RDS variation as small as possible.

As described before, Running Digital Sum 1 (RDS1) of the kth block is produced simultaneously with encoding each byte of the input data block. A merging bit selector 203 compares RDS1 of the kth block like this to RDS0 of the k-1th block to select the merging bit.

In other words, when the kth block is produced in comparing RDS1 of the kth block to RDS0 of the k-1th block, the merging bit is selected from 000, 001, 010 and 100 so that RDS has the minimum value while the RLL does not violate run-length constraints.

In this case, a merging bit of three bit is used, which is selected taking account of the RDSs of the present block and the next block.

The encoded kth block is outputted (204) after previously outputting the merging bit selected like this, and simultaneously RDSO up to the kth block is updated to prepare merging bit selection of the k+1th block.

A series of processes like this are repeated to obtain modulated digital data.

The modulated digital data are modulated in such a manner that the input data are bound to blocks with the minimum two bytes in unit, and a merging bit is added in a channel data block unit corresponding to each of the input blocks.

In this case, the input data can be bound in three to seven byte unit to execute a merging process in block unit. Then, a modulation code having 0.5 to 0.5185 code rate can be obtained according to the block size (3 to 7 bytes) of the input data.

Figure 3:
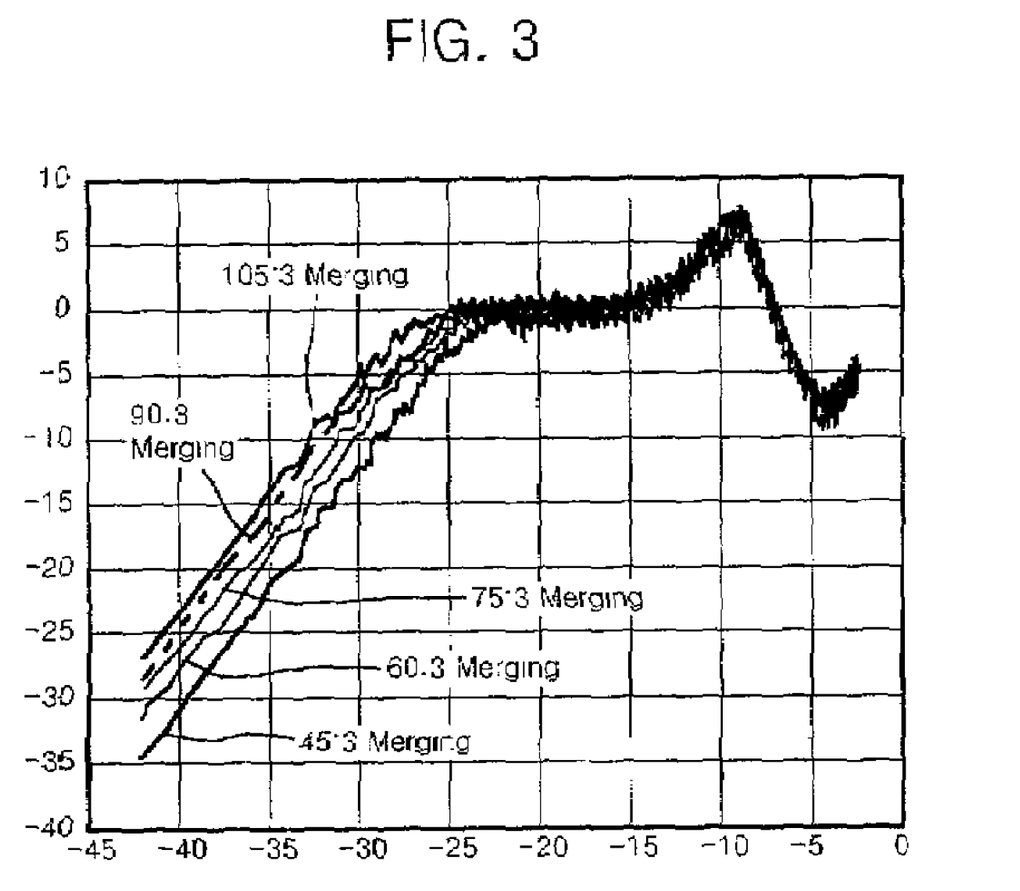
FIG. 3 is a graph for showing a DC compression when the unit m of one block is varied from 3 to 7 according to the invention.
Figure 4A:
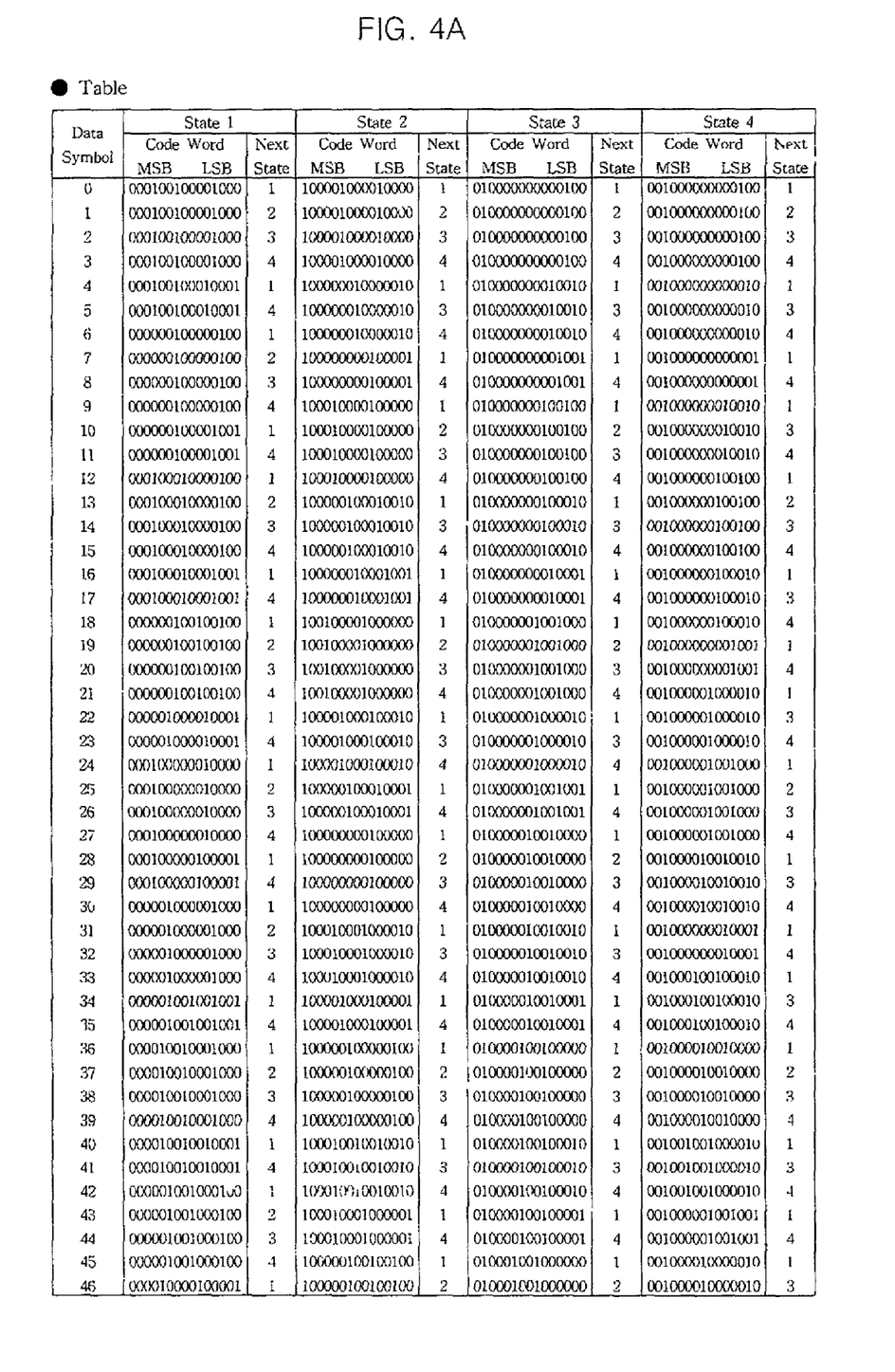
FIGS. 4A to 4F show digital data modulation code tables according to the invention.
Figure 4B:
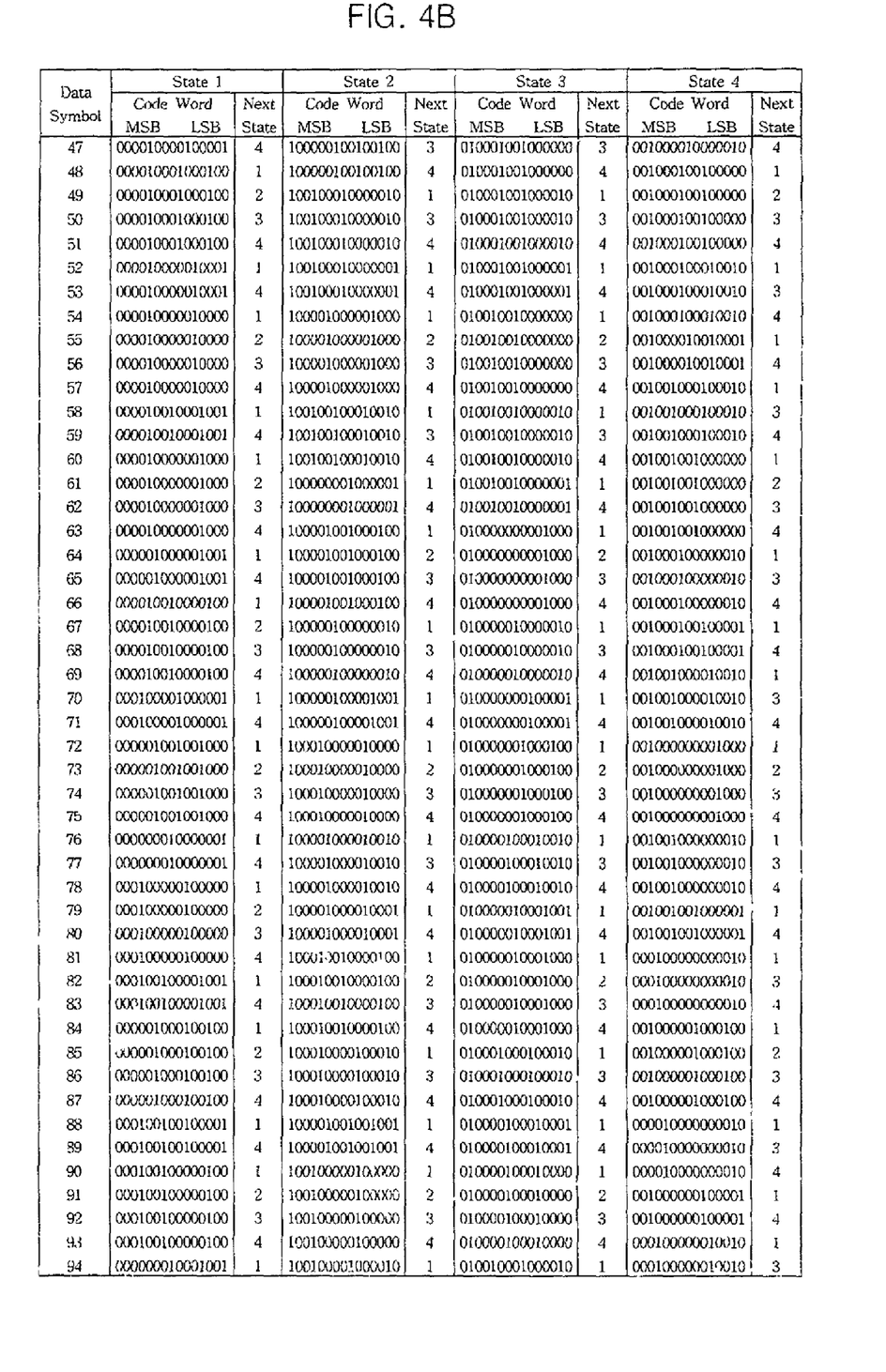
Figure 4C:
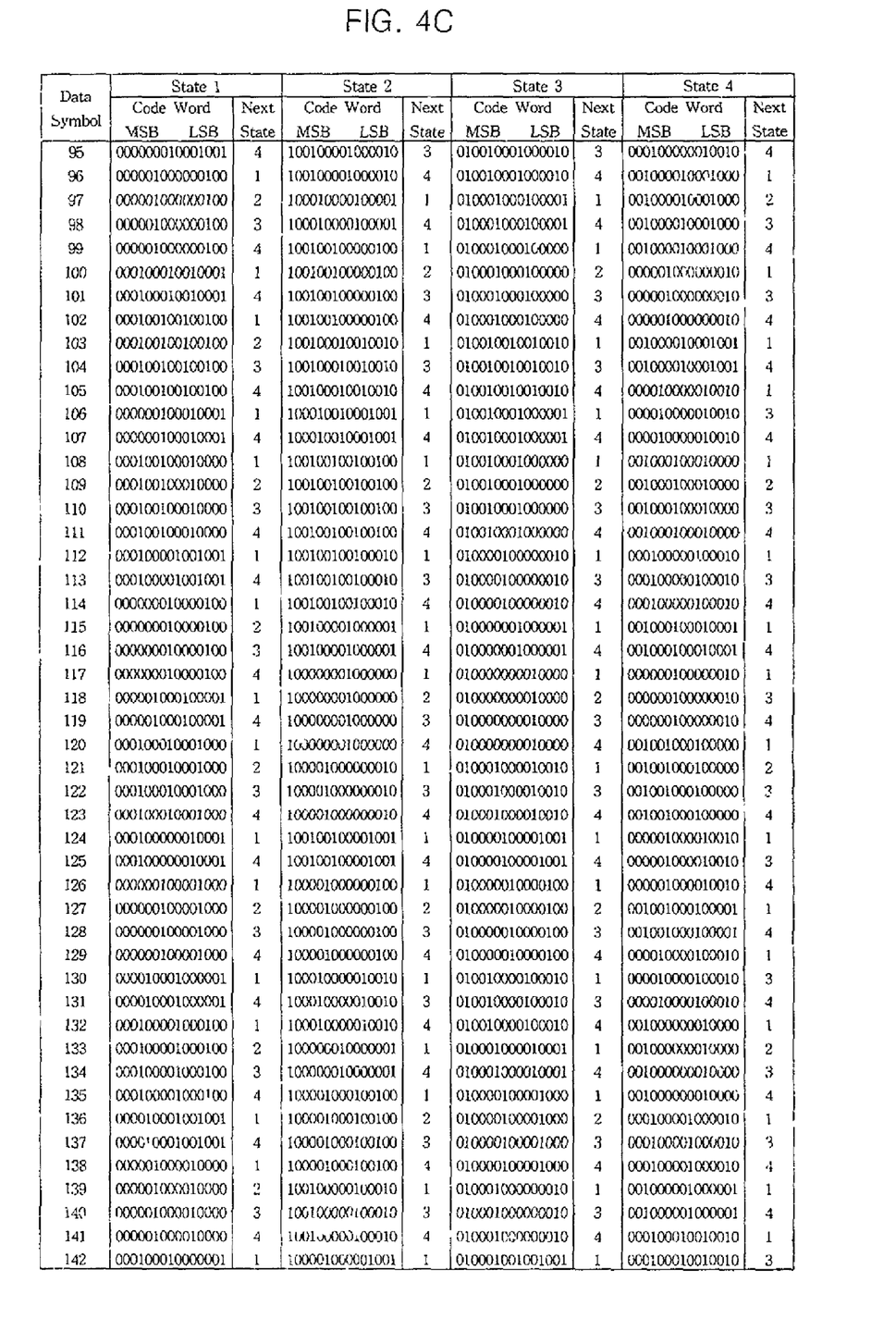
Figure 4D:
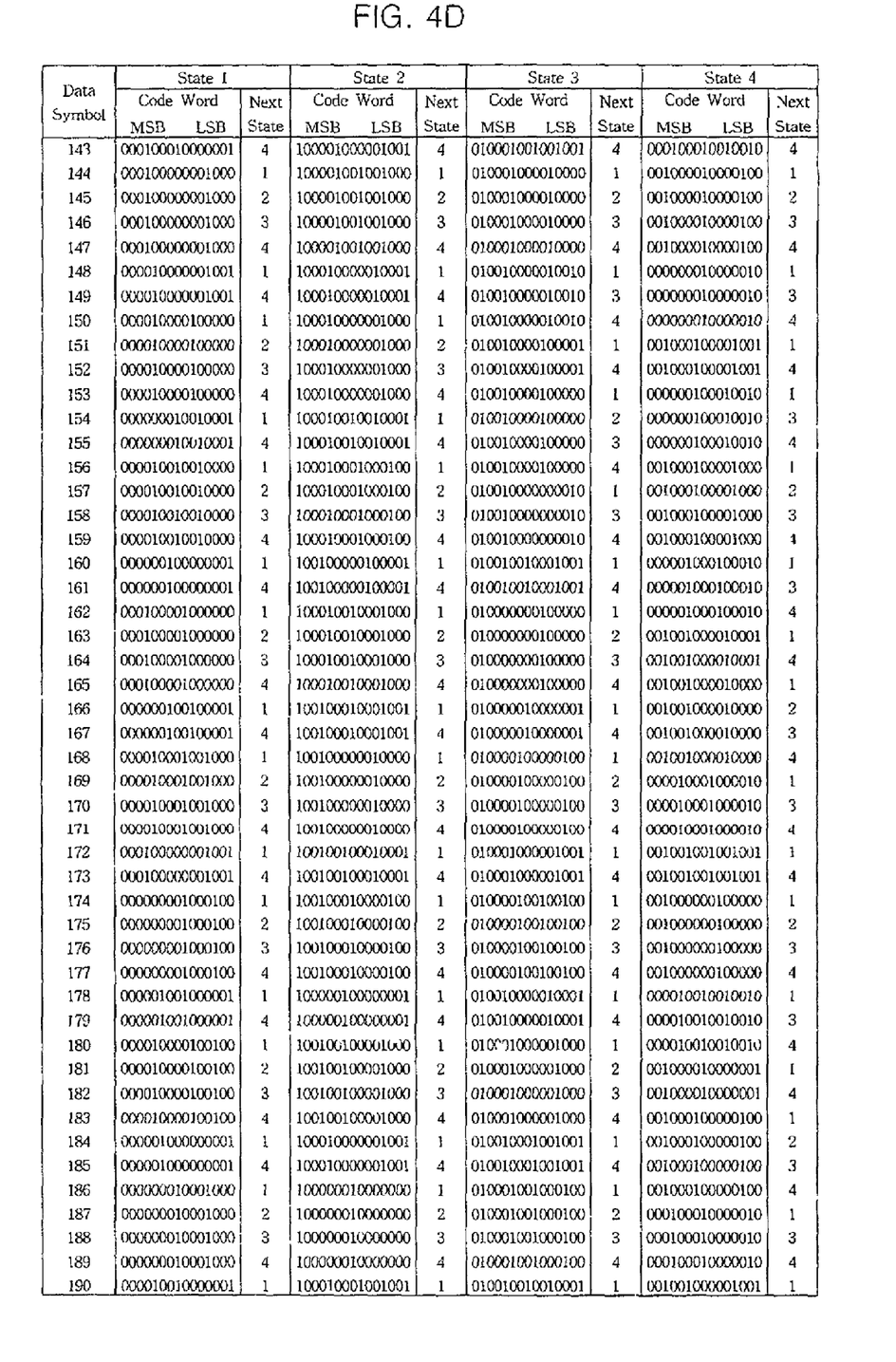
Figure 4E:
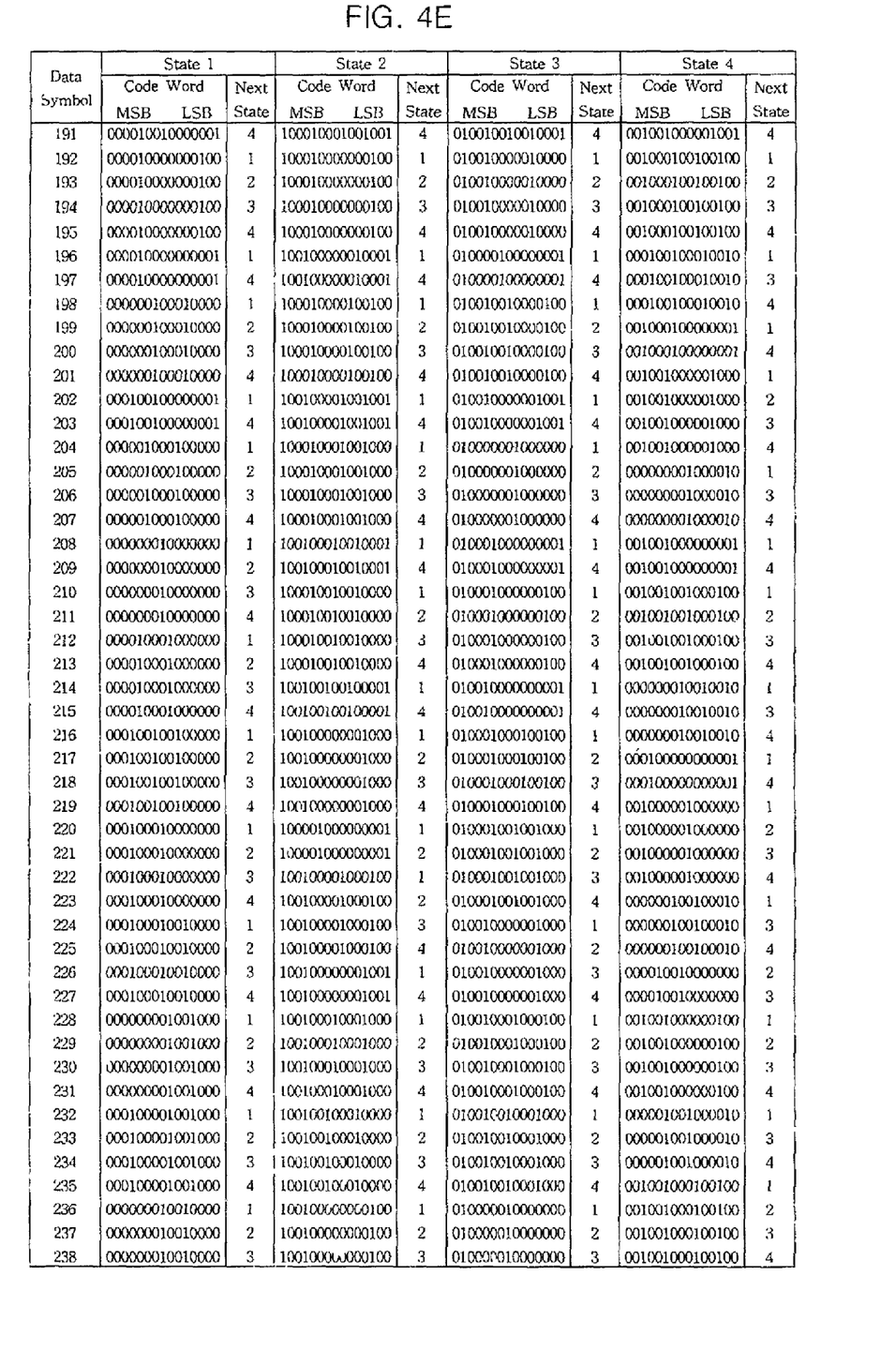
Figure 4F:
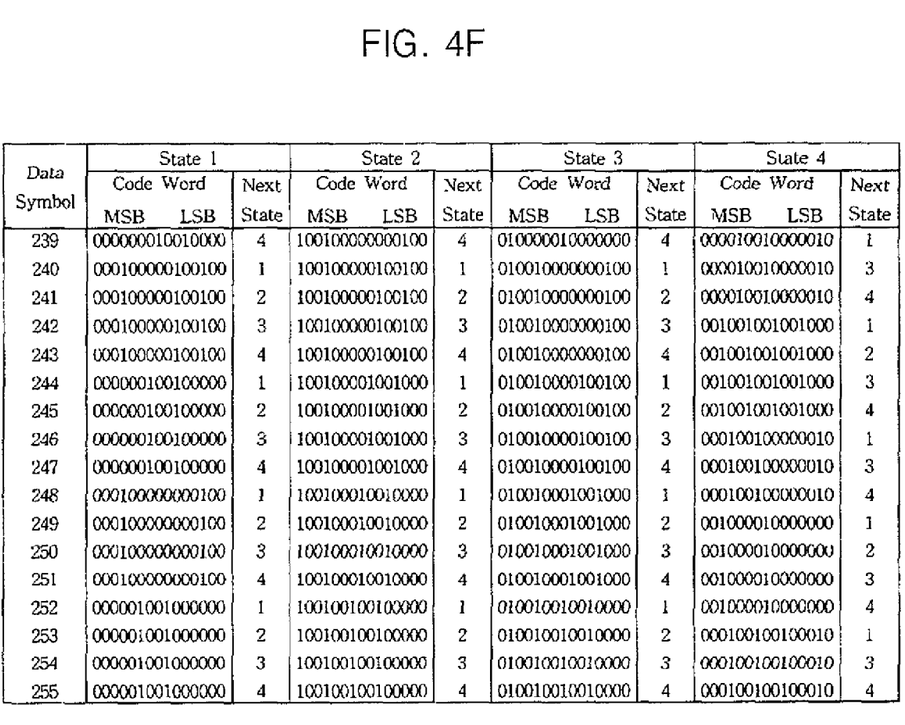

FIG. 3 shows a DC control ability when varying the unit m of one block from three to seven. This shows a result (45:3 merging) in which the three bit input (24 bits) is 8/15 modulation-coded (45 bits) and then added with the merging bit, and the ability is −32 dB at the frequency of 0.0001 $f_c$.

FIGS. 4A to 4F show an example of the 8/15(2,15) modulation table used in the method of digital data modulation of the invention, in which one conversion table is used for 256 inputs (1 byte) with a status number of four.

As described before, the merging bit is added in block unit in modulating the digital data thereby incurring improvement of the DC compression ability and the code rate.

When the merging bit is added in block unit in modulating the digital data, one block is preferably constituted by binding three to seven bytes. Therefore, the block is necessarily defined in byte number suitable for the environment of data processing. When an information expressing the number of bytes constituting one block or the number of data constituting a unit block of the added merging bits is recorded together in recording the modulation data, a merging process and a data decoding can be executed correctly for a corresponding block in decoding by using this recorded information.

In other words, when the digital data are recorded through modulation encoding, n (n is an integer at least 2, for example 3 to 7) byte unit of process data or information is recorded together, a decoder can judge how many bytes constitute a corresponding block by using the information in block unit and accordingly perform data decoding and reproduction suitable thereto.

According to the present invention as described hereinbefore, several input data are bound to define the block unit and the method of adding the merging bits in block unit is used in modulation of the digital data thereby improving the code rate and DC compression ability.

According to the method of data modulation of the invention, the modulated code of the 0.5 to 0.5185 code rate can be obtained according to the block size (3 to 7 bytes) of the input data.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method of recording digital data, the method comprising:
    binding input digital data into unit blocks, each unit block comprising a plurality of bytes;
    modulation-coding each of the plurality of bytes of the unit blocks according to a code conversion table;
    adding at least one merging bit followed by each modulation-coded unit block; and
    recording byte-unit information indicating the number of bytes comprising each unit block together with each modulation-coded unit block to which the at least one merging bit was added.

2. The method of claim 1, wherein each unit block comprises three to seven bytes.

3. The method of claim 1, wherein three merging bits are added.

4. The method of claim 1, wherein each of the plurality of bytes is modulation-coded into a code word of a fifteen bits according to an 8/15 conversion table.

5. The method of claim 1, wherein adding the at least one merging bit comprises comparing a running digital sum (RDS) of a present unit block to an RDS of a previous unit block such that the RDS is minimized without violating a run length limited (RLL) restraint.

6. The method of claim 5, further comprising primarily outputting the at least one merging bit followed by the modulation-coded present unit block while simultaneously updating the running digital sum (RDS) up to the present unit block to prepare for addition of at least one merging bit to a next unit block.

7. A method of recording digital data, the method comprising:
    performing modulation-coding of an input data block of m bytes and simultaneously producing a running digital sum (RDS) of the input data block;
    evaluating the RDS of the input data block and an RDS of a previous input data block to select at least one merging bit;
    outputting the selected at least one merging bit, followed by the modulation-coded input data block, and updating the ROS for selecting at least one merging bit for a next input data block; and
    recording byte-unit information indicating the number of bytes comprising the input data block together with the modulation-coded input data block and the selected at least one merging bit.

8. The method of claim 7, wherein m is three to seven bytes.

9. The method of claim 7, wherein three merging bits are selected.

10. A method of recording and reproducing digital data, the method comprising:
    binding input digital data into unit blocks, each unit block comprising a plurality of bytes;
    modulation-coding each of the unit blocks;
    adding at least one merging bit followed by each modulation-coded unit block;
    recording byte-unit information indicating the number of bytes comprising each unit block together with modulation-coded data to which the at least one merging bit was added; and
    decoding each unit block using the corresponding recorded byte-unit information.

11. The method of claim 10, wherein each of the unit blocks comprises three to seven bytes.

12. The method of claim 10, wherein the at least one merging bit is added such that a running digital sum (RdS) value is minimized without violating a run length limited (RLL) restraint.

13. The method of claim 10, wherein three merging bits are added to each modulation-coded unit block.

14. The method of claim 10, wherein each of the unit blocks is modulation-coded into a code word of a fifteen bits according to an 8/15 conversion table.

15. The method of claim 12, wherein adding the at least one merging bit comprises comparing a running digital sum (RDS) of a present unit block to an RDS of a previous unit block.

16. The method of claim 15, further comprising primarily outputting the at least one merging bit followed by the modulation-coded present unit block while simultaneously updating the running digital sum (RDS) up to the present unit block to prepare for addition of at least one merging bit to a next unit block.

17. A method of recording digital data, the method comprising:
    binding input digital data into unit blocks, each unit block comprising a plurality of bytes;
    modulation-coding each of the plurality of bytes of the unit blocks according to a code conversion table;
    comparing a running digital sum (RDS) of a present unit block to an RDS of a previous unit block to allocate at least one merging bit for the present modulation-coded unit block such that the RDS is minimized without violating a run length limited (RLL) restraint;

primarily outputting the at least one merging bit followed by the modulation-coded present unit block while simultaneously updating the RDS up to the present unit block to prepare for allocation of at least one merging bit for a next unit block; and recording byte-unit information indicating the number of bytes comprising each unit block together with the modulation-coded present unit block and the at least one merging bit.

18. The method of claim 17, wherein each unit block comprises three to seven bytes.

19. The method of claim 17, wherein three merging bits are allocated for each modulation-coded unit block.

20. The method of claim 17, wherein each of the plurality of bytes is modulation-coded into a code word of a fifteen bits according to an 8/15 conversion table.

* * * * *